US010698784B2

(12) United States Patent
Tsirkin

(10) Patent No.: US 10,698,784 B2
(45) Date of Patent: Jun. 30, 2020

(54) ROBUST PERIPHERAL COMPONENT INTERCONNECT SURPRISE REMOVAL DETECTION

(71) Applicant: Red Hat, Inc., Raleigh, NC (US)

(72) Inventor: Michael Tsirkin, Westford, MA (US)

(73) Assignee: RED HAT, INC., Raleigh, NC (US)

( * ) Notice: Subject to any disclaimer, the term of this patent is extended or adjusted under 35 U.S.C. 154(b) by 25 days.

(21) Appl. No.: 16/200,056

(22) Filed: Nov. 26, 2018

(65) Prior Publication Data

US 2020/0167308 A1    May 28, 2020

(51) Int. Cl.
| | | |
|---|---|---|
| *G06F 11/30* | (2006.01) | |
| *G06F 13/42* | (2006.01) | |
| *G06F 9/455* | (2018.01) | |
| *G06F 13/40* | (2006.01) | |
| *G06F 9/4401* | (2018.01) | |

(52) U.S. Cl.
CPC ...... *G06F 11/3051* (2013.01); *G06F 9/45558* (2013.01); *G06F 13/4081* (2013.01); *G06F 13/423* (2013.01); *G06F 9/4413* (2013.01); *G06F 13/4221* (2013.01); *G06F 2009/45579* (2013.01)

(58) Field of Classification Search
CPC ............... G06F 9/4413; G06F 9/45558; G06F 11/3051; G06F 13/4221; G06F 13/423; G06F 13/4265; G06F 2009/45579; G06F 2213/0026

See application file for complete search history.

(56) References Cited

U.S. PATENT DOCUMENTS

| | | | |
|---|---|---|---|
| 7,191,255 B2 | 3/2007 | Wong et al. | |
| 10,255,151 B1 * | 4/2019 | Levin | G06F 11/2221 |
| 2007/0233928 A1 * | 10/2007 | Gough | G06F 9/4413 |
| | | | 710/301 |
| 2011/0113178 A1 * | 5/2011 | Hosoi | G06F 13/4072 |
| | | | 710/313 |

(Continued)

OTHER PUBLICATIONS

Simon Graham, Stratus Technologies International, Sarl; "Writing Drivers for Reliability, Robustness and Fault Tolerant Systems"; https://download.microsoft.com/download/5/b/5/5b5bec17-ea71-4653-9539-204a672f11cf/FTdrv.doc.; WinHEC Version—Apr. 28, 2004; © 2004 Microsoft Corporation; PDF retrieved on Aug. 3, 2018; (12 Pages).

(Continued)

*Primary Examiner* — Eric T Oberly
(74) *Attorney, Agent, or Firm* — K&L Gates LLP

(57) ABSTRACT

A system includes a device, a device driver associated with the device, and an operating system (OS). The OS is configured to receive, from the device driver, a testing address to a register, obtain a testing value associated with the testing address, receive a memory read request, read device memory associated with the memory read request to obtain a value, and compare the value to an error pattern to determine a first status of the memory read as one of matching and mismatching the error pattern. Responsive to determining the first status as matching, the operating system is further configured to read the testing address to determine a second status of the testing value as one of matching and mismatching the error pattern. Responsive to determining the second status as matching, the operating system is configured to return an error to the device driver.

20 Claims, 7 Drawing Sheets

(56) References Cited

U.S. PATENT DOCUMENTS

| | | | |
|---|---|---|---|
| 2013/0060987 A1* | 3/2013 | Bolen | G06F 13/00 710/316 |
| 2017/0046187 A1* | 2/2017 | Tsirkin | G06F 9/45558 |
| 2019/0041964 A1* | 2/2019 | Gadey NV | G06F 1/3287 |
| 2019/0042281 A1* | 2/2019 | Raghav | G06F 9/44505 |

OTHER PUBLICATIONS

Peter Onufryk, IDT; Joe Cowan, HP; Michael Krause, HP; "Downstream Port Containment (DPC)" https://pcisig.com/sites/default/files/specification_documents/ECN_DPC_2012-02-09_finalized.pdf Introduced: Aug. 11, 2011; Last Updated: Feb. 2, 2012; Final Approval by PWG: Feb. 9, 2012; PCI Express Base Specification Revision 3.0; PDF retrieved on Aug. 3, 2018; (20 Pages).

* cited by examiner

ROBUST PERIPHERAL COMPONENT INTERCONNECT SURPRISE REMOVAL DETECTION

BACKGROUND

Various components of computer systems may routinely communicate with each other. For example, input/output devices and peripheral component interconnect devices may communicate using a bus (e.g., a PCI bus). The various devices may also be associated with device drivers that communicate with the operating system to send memory read requests and receive memory values associated with the requests. However, during operating, devices may be removed by surprise or may fail, which may result in the computer system crashing.

SUMMARY

The present disclosure provides new and innovative systems and methods for surprise removal detection of devices, such as peripheral component interconnect ("PCI") devices. In an example, a method includes receiving, by an operating system (OS), from a device driver, a testing address to a register. The method also includes obtaining, by the OS, a testing value associated with the testing address. Additionally, the method includes receiving, by the OS, a memory read request that identifies a device addressed by the request. The method further includes reading, by the OS, device memory associated with the memory read request to obtain a value and comparing, by the OS, the value to an error pattern to determine a first status of the memory read as one of matching and mismatching the error pattern. The method also includes responsive to determining the first status as matching the error pattern, reading, by the OS, the testing address to determine a second status of the testing value as one of matching and mismatching the error pattern. Additionally, the method includes responsive to determining the second status as matching, returning, by the OS, an error to the device driver.

In an example, a method includes receiving, by an operating system (OS), from a device driver, a testing address to a register. The method also includes obtaining, by the OS, a testing value associated with the testing address. Additionally, the method includes receiving, by the OS, a memory read request that identifies a device addressed by the request. The method also includes reading, by the OS, device memory associated with the memory read request to obtain a value and comparing, by the OS, the value to an error pattern to determine a first status of the memory read as one of matching and mismatching the error pattern. The method also includes responsive to determining the first status as matching the error pattern, reading, by the OS, the testing address to determine a second status of the testing value as one of matching and mismatching the error pattern. Additionally, the method includes responsive to determining the second status as mismatching, returning, by the OS, the value to the device driver with an indication of success.

In an example, a system includes a device, a device driver associated with the device, and an operating system (OS). The operating system is configured to receive, from the device driver, a testing address to a register, obtain a testing value associated with the testing address, receive a memory read request that identifies a device addressed by the request, read device memory associated with the memory read request to obtain a value, and compare the value to an error pattern to determine a first status of the memory read as one of matching and mismatching the error pattern. Responsive to determining the first status as matching the error pattern, the operating system is further configured to read the testing address to determine a second status of the testing value as one of matching and mismatching the error pattern. Responsive to determining the second status as matching, the operating system is configured to return an error to the device driver.

Additional features and advantages of the disclosed method and apparatus are described in, and will be apparent from, the following Detailed Description and the Figures. The features and advantages described herein are not all-inclusive and, in particular, many additional features and advantages will be apparent to one of ordinary skill in the art in view of the figures and description. Moreover, it should be noted that the language used in the specification has been principally selected for readability and instructional purposes, and not to limit the scope of the inventive subject matter.

DETAILED DESCRIPTION OF EXAMPLE EMBODIMENTS

Figure 1:
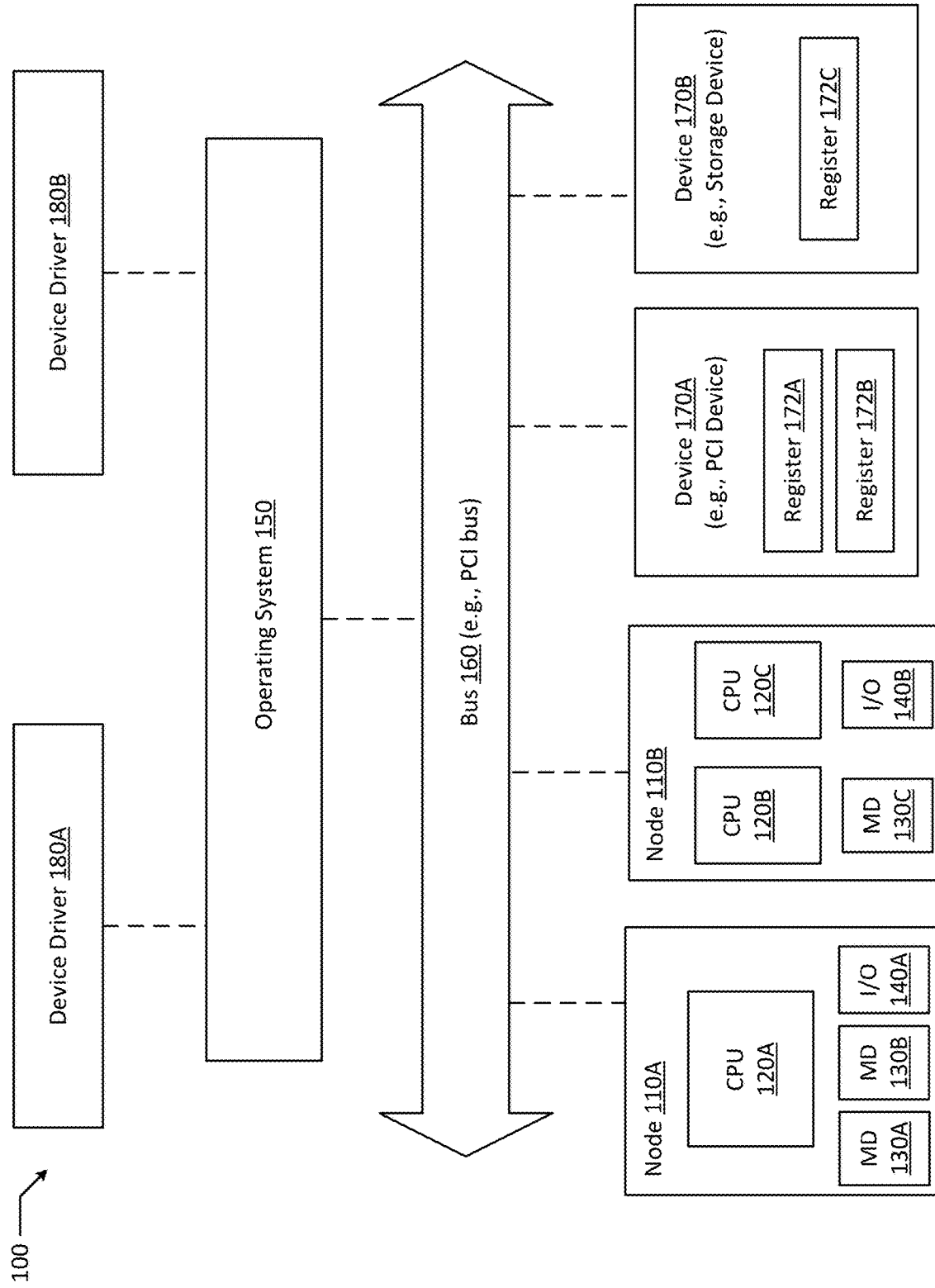
FIG. 1 illustrates a block diagram of an example computing system according to an example embodiment of the present disclosure.

Techniques are disclosed for detecting surprise removal of peripheral component interconnect ("PCI") devices. Surprise removal of PCI devices poses a unique challenges as a device can disappear at any time. Typically, when a PCI device disappears, an interrupt is triggered by a PCI bridge, which is a special PCI device that glues the PCI buses of the system together. The interrupt may be detected by an operating system and a flag can be set such that following attempts to read device memory may check the set flag and return an error to a driver associated with the device read request. For example, the OS may expose an interface to the driver to access device memory. When the interface is invoked, the interface may check for the flag and if the flag is set, return an error. Once an error has been returned, the driver can then recover, for example by switching to a different device. Unfortunately, the interrupt discussed above is asynchronous and thus not a robust method for detecting surprise removal.

Because the interrupt is asynchronous, current techniques for detecting surprise removal lacks robustness. For example, if a device memory read is outstanding, the read may get terminated with a master abort error leaving a CPU without a way to report the error to the driver. For example, the driver may get an all-ones value (e.g., 0xFF). The driver can recover if the all-ones value happens to be an invalid value. However, if the all-ones value is a valid value, the driver is unable to distinguish between the valid value and a surprise removal. In the case of the all-ones value being a valid value, the driver may have to wait for an interrupt to eventually be triggered. In some cases, a flag may not get set immediately to report errors as the flag may have been previously disabled.

As described in the various example embodiments disclosed herein, to improve detection of surprise removal, which makes handling of the surprise removal more reliable especially on hypervisors, the driver provides the OS a testing address (e.g., an offset in device memory) to a register, which has a value that is not equal to an all-ones value. For example, the testing address may be provided in a request with an offset to determine the location in which the data is stored. The offset may denote the number of address locations added to the base address in order to get to a specific absolute address.

During operation, the driver requests a memory read and the OS may compare the result (e.g., value of the memory read) to an all-ones pattern. For example, the OS may compare the bytes in the value to the all-ones pattern according to a length read. If the values do not match, then the memory read value is returned to the driver with an indication of success. However, if the values match (e.g., both are all-ones values), then the OS executes another read from the testing address, which is a known value that is not equal to an all-ones value. If the read from the testing address matches the all-ones value, then the driver receives an error, which indicates that the device was removed by surprise. However, if the values do not match, then the original memory read value may be returned to the driver with an indication of success. By doing so, the present disclosure advantageously distinguishes memory reads resulting in an all-ones value as either indicating a surprise removal condition or a valid read (e.g., where a register storing valid data matches 0xFF or an all-ones value). Since it is typically rare for a register to match 0xFF or an all-ones value, the present disclosure advantageously detects surprise removal without significant additional overhead to the system since this additional check will likely occur infrequently.

The above techniques may provide more efficient and robust systems and methods for detecting surprise PCI removal. For example, software companies such as Red Hat may want to provide the above functionality to operating systems (e.g., Red Hat Enterprise Linux® ("RHEL")) to improve performance and reduce down time (e.g., when a device is unplugged and an interrupt has not been sent yet). The systems and methods disclosed herein may be particularly beneficial and useful for userspace drivers where the operating system loads the driver internally and the driver accesses a device through OS application program interfaces (APIs).

The additional functionality (e.g., checking the testing address) advantageously improves performance and reduces and/or prevents the driver from crashing. For example, current techniques may require approximately a tenth of a microsecond to detect and/or remedy surprise removal (e.g., via an interrupt) while the example embodiments disclosed herein may detect surprise removal in the matter of nanoseconds. Additionally, if a surprise removal goes undetected, the driver might crash after receiving an all-ones value. For example, when the driver encounters an unexpected problem, the driver may halt the system or crash, resulting in a blue screen. The presently disclosed techniques advantageously avoids the crash (e.g., blue screen) while adding minimal overhead to the system.

FIG. 1 depicts a high-level component diagram of an example computing system 100 in accordance with one or more aspects of the present disclosure. The computing system 100 may include an operating system ("OS") 150 connected to nodes (e.g., nodes 110A-B) and devices 170A-B via a bus 160 (e.g., PCI bus). The OS may also be associated with device drivers 180A-B. The device drivers 180A-B may be configured to send memory read requests to OS 150. For example, device driver 180A may be associated with device 170A (e.g., PCI device) and driver 180B may be associated with device 170B (e.g., storage device). The device drivers 180A-B, hereinafter referred to generally as device driver 180 may be configured to send requests to OS 150 that indicate the device (e.g., device 170) and/or the register (e.g., register 172A) addressed by the read request.

Registers 172A-C are device registers. For example, registers 172A-B are associated with device 170A and register 172C is associated with device 170B. The registers may be vector control registers within a message signaled interrupts (MSI) table or an MSI-X table. The vector control register within an MSI-X table typically has hexidecimal memory values of "0" and "1". Other possible registers that are often present in a device and which may be used for a testing address are device identifier registers.

In order to efficiently detect surprise removal, the device driver 180 may establish a testing address with a known testing value that is not an all-ones pattern. The OS 150 may receive the testing address to obtain the testing value, which it can later use to compare against future memory reads. After receiving a memory read request from a device driver 180, the OS 150 may be configured to read the device memory associated with the read request to obtain a value. For example, the OS 150 may read an address or offset in device memory associated with the request. As discussed above, the offset may denote the number of address locations added to the base address in order to get to a specific absolute address. Additionally, the offset may denote a distance from a known memory address. The OS 150 may compare the received value to an all-ones pattern to determine if the memory read resulted in a valid value. If the memory read value matches the all-ones pattern (e.g., 0xFF), then the OS may read the testing address to obtain the testing value again. If the testing value is now an all-ones pattern, then the OS can determine that surprise removal has occurred and can report the error to the device driver 180 so the driver 180 can connect to a new device.

Bus 160 may be a PCI Express bus that uses high-speed serial signaling and allows for point-to-point communication between devices. Communications along a PCI Express connection may be made using packets.

Each node 110A-B may in turn include one or more physical processors (e.g., CPU 120A-C) communicatively coupled to memory devices (e.g., MD 130A-C) and input/output devices (e.g., I/O 140A-B). Each node 110A-B may be a computer, such as a physical machine and may include a device, such as hardware device. In an example, a hardware device may include a network device (e.g., a network adapter or any other component that connects a computer to a computer network), a peripheral component interconnect (PCI) device, storage devices, disk drives, sound or video adaptors, photo/video cameras, printer devices, keyboards, displays, etc.

As used herein, processors or physical processor (e.g., CPUs 120A-C) refers to a device capable of executing instructions encoding arithmetic, logical, and/or I/O operations. In one illustrative example, a processor may follow Von Neumann architectural model and may include an arithmetic logic unit (ALU), a control unit, and a plurality of registers. In a further aspect, a processor may be a single core processor which is typically capable of executing one instruction at a time (or process a single pipeline of instructions), or a multi-core processor which may simultaneously execute multiple instructions. In another aspect, a processor may be implemented as a single integrated circuit, two or more integrated circuits, or may be a component of a multi-chip module (e.g., in which individual microprocessor dies are included in a single integrated circuit package and hence share a single socket). A processor may also be referred to as a central processing unit (CPU).

As discussed herein, a memory device 130A-C refers to a volatile or non-volatile memory device, such as RAM, ROM, EEPROM, or any other device capable of storing data. As discussed herein, I/O device 140A-C refers to a device capable of providing an interface between one or more processor pins and an external device capable of inputting and/or outputting binary data.

Processors (e.g., CPUs 120A-C) may be interconnected using a variety of techniques, ranging from a point-to-point processor interconnect, to a system area network, such as an Ethernet-based network. Local connections within each node, including the connections between a processor (e.g., CPU 120A-C) and a memory device 130A-C may be provided by one or more local buses of suitable architecture, for example, peripheral component interconnect (PCI).

Figure 2:
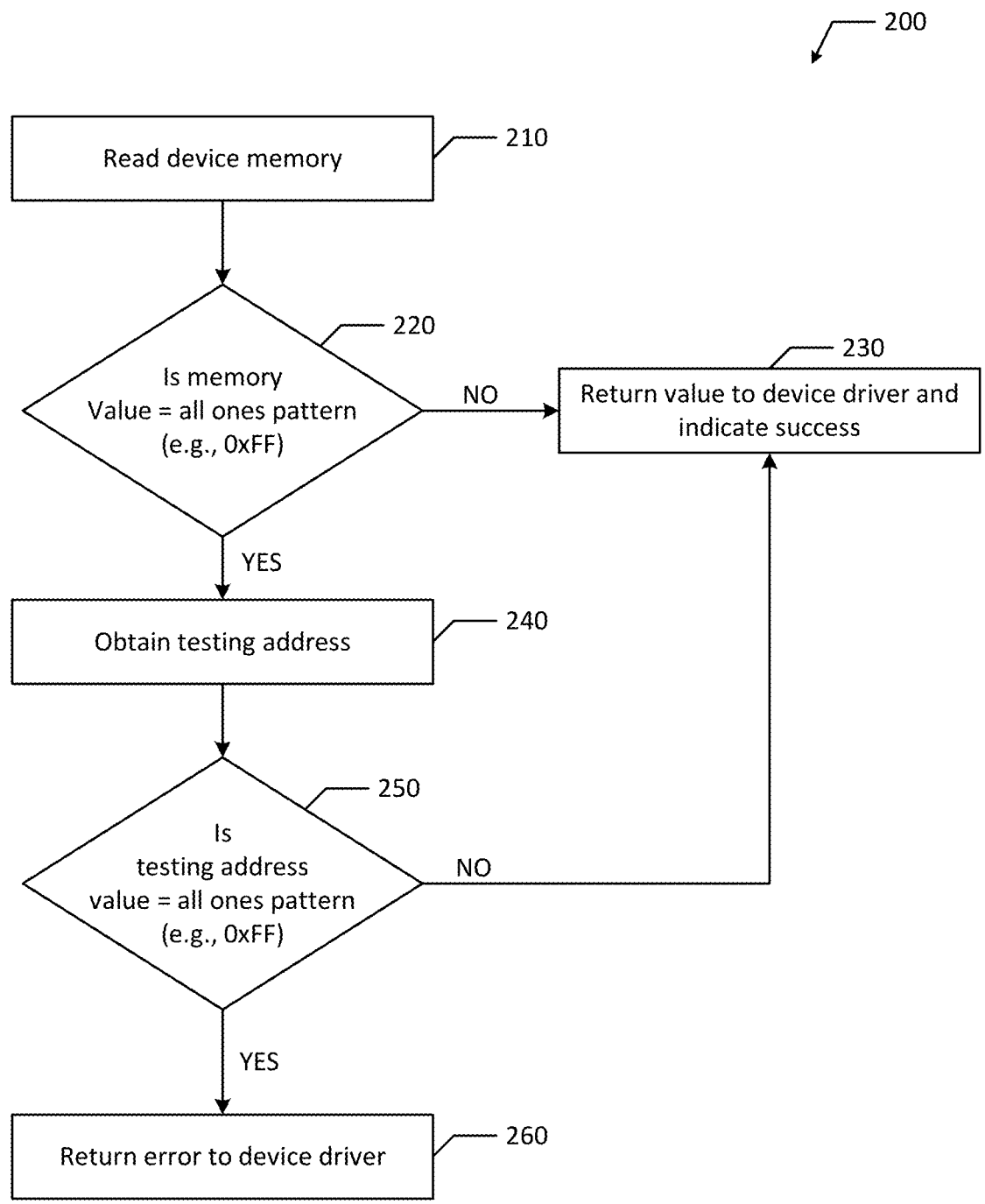
FIG. 2 illustrates a flowchart of an example process for surprise removal detection according to an example embodiment of the present disclosure.

FIG. 2 illustrates a flowchart of an example method 200 for surprise removal detection of a device 170A such as a PCI device. Although the example method 200 is described with reference to the flowchart illustrated in FIG. 2, it will be appreciated that many other methods of performing the acts associated with the method 200 may be used. For example, the order of some of the blocks may be changed, certain blocks may be combined with other blocks, one or more blocks may be repeated, and some of the blocks described are optional. The method 200 may be performed by processing logic that may comprise hardware (circuitry, dedicated logic, etc.), software, or a combination of both.

The example method 200 includes reading device memory (block 210) to obtain a memory value. The memory value is compared to an all-ones pattern (block 220) and if the memory value is not equal to an all-ones pattern (e.g., 0xFF), then the value is turned to a device driver with an indication of success (block 230). However, if the value matches the all-ones pattern, then a testing address is obtained (block 230) and the value of the testing address is compared to the all-ones pattern (block 250). In an example, the operating system may read an event mask from the device. If the event mask is read as one byte, and if all eight events trigger at the same time, an all-ones value (e.g., 0xFF) may be returned. In another example, a two-byte field may be read using two one-byte reads. If one of the reads triggers after device removal, the read may return a partial all-ones pattern (e.g., 0x12FF) instead of the expected value (e.g., 0x1234).

The value of the testing address is a known value from a register other than the all-ones value. If the value of the testing address matches the all-ones pattern, then the method includes returning an error to the device driver (block 260) because it has been confirmed that the surprise removal occurred. If the value of the testing address does not match the all-ones pattern, then the original value is turned to the device driver with an indication of success (block 230). By performing an additional check with a testing address (e.g., at blocks 240 and 250), the method 200 may advantageously determine whether an all-ones value is a valid register value or whether the value is a result of a surprise removal, which advantageously prevents additional memory read requests being sent for a device that has already been removed. Additionally, by detecting a surprise removal early, the system may recover sooner without having to wait for the typical interrupt process.

In another example, the value of the testing address may be stored in a CPU register, as opposed to register 172A in device 170. Then, to determine if the device 170 has been removed, the OS 150 may read the testing address within the device 170 or device register 172A and compare that value to the testing address value stored in the CPU register. If the values match, then the OS 150 may determine that the device is still properly connected and that the original requested memory read resulting in an all-ones value (e.g., 0xFF) was a valid value (e.g., the device 170A utilizes all bits and thus the all-ones value from the memory read is valid). However, if the testing value read from the testing address does not match the value stored in the CPU register, then the OS 150 may determine that the device 170A was removed by surprise or that another problem exists with the device or occurred during transmission of the data. Storing the testing value in a CPU register may enable fast compare times to minimize latency for this process.

Figure 3:
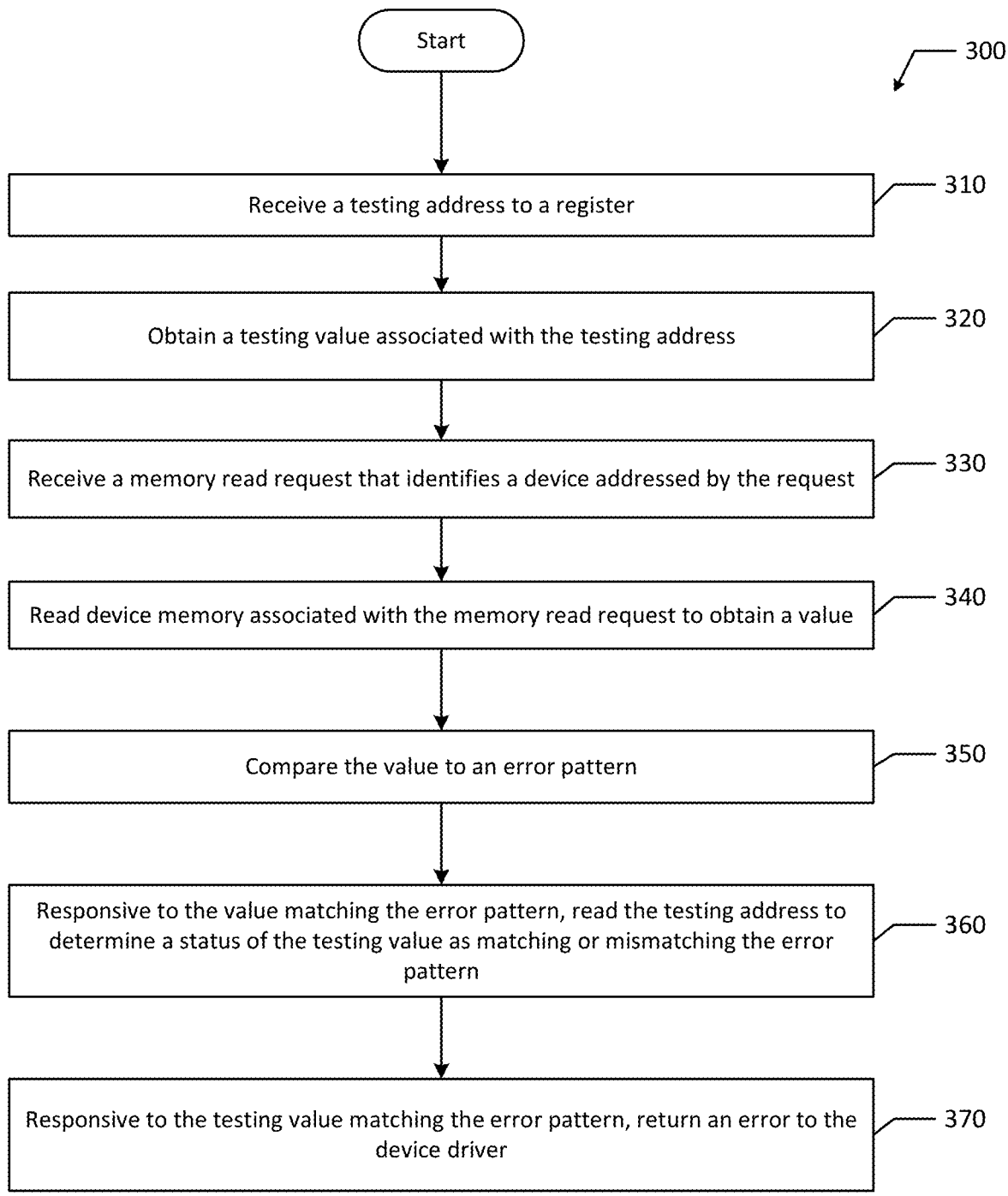
FIG. 3 illustrates a flowchart of an example process for surprise removal detection according to an example embodiment of the present disclosure.

FIG. 3 illustrates a flowchart of an example method 300 for surprise removal detection according to an example embodiment of the present disclosure. Although the example method 300 is described with reference to the flowchart illustrated in FIG. 3, it will be appreciated that many other methods of performing the acts associated with the method 300 may be used. For example, the order of some of the blocks may be changed, certain blocks may be combined with other blocks, one or more blocks may be repeated, and some of the blocks described are optional. The method 300 may be performed by processing logic that may comprise hardware (circuitry, dedicated logic, etc.), software, or a combination of both.

The example method 300 includes detecting a testing address to a register (block 310). For example, an OS 150 may receive a testing address from a device driver 180. The testing address may be an address to a register (e.g., register 172B) with a known-value other than an all-ones value. Then, the OS may obtain a testing value associated with the testing address (block 320). In an example, the OS 150 may read the testing address to obtain the testing value. In another example, the OS 150 may receive the testing value from the device driver 180. The testing value may be a value in a vector control register (e.g., register 172A) within an MSI-X table of the device (e.g., device 170A). In another example, the testing value may be a value in a device identifier register (e.g., register 172B), however, access to a device identifier register may be slower than access to other registers, and thus may not provide the same performance benefits of selecting a testing address from a vector control register.

The OS may also receive a memory read request that identifies a device addressed by the request (block 330). For example, during operation, the driver 180 may request a memory read. In an example, the request may identify the device (e.g., device 170A) that the request is addressed. Then, the OS may read device memory associated with the memory read request to obtain a value (block 340). For example, the OS 150 may receive the request and read device memory associated with the memory read request to obtain a value at the requested address.

After obtaining the value, the OS may compare the value to an error pattern (block 350). For example, the OS 150 may compare the value to an error pattern, such as an all-ones pattern (e.g., 0xFF). In an example, OS 150 compares the bytes in the value to the all-ones pattern according to a length read. In another example, the OS 150 may compare the value to the all-ones pattern using "memcmp", which compares the bytes of a first block of memory to bytes of a second block of memory. Additionally, the OS 150 may compare the value to the all-ones pattern with a "memchr" function, which scans the initial "n" bytes for the first instance of a specific character.

Responsive to the value matching the error pattern, the OS may read the testing address to determine a status of the testing value as matching the error pattern (block 360). For example, if the value from the request to read device memory matches the error pattern, the OS 150 may read the testing address to determine if surprise removal has occurred. Since the testing address is a known value selected from a register (e.g., register 172A), the OS may perform an additional read of the testing address to determine if the value from the original read request is a valid value (e.g., the device 170A utilizes all bits and thus the all-ones value from the memory read is valid) or if the all-ones value from the original read request indicates that the device 170A was removed by surprise.

Responsive to the testing value matching the error pattern, the OS may return an error to the device driver (block 370). The testing value matching the error pattern indicates that reading device memory from the known testing value (e.g., a value that is not all-ones) resulted in an unexpected result (e.g., an all-ones pattern) and thus the device 170A has been removed by surprise. For example, the OS 150 may return an error to the device driver 180 if the testing value also matches the error pattern or all-ones pattern. Since the testing address is selected to be a valid value, if the testing value matches the error pattern, then the OS 150 has confirmed that surprise removal has occurred as the register (e.g., register 172A) is no longer connected and the memory read to the testing address results in an all-ones value.

Again, as mentioned above, the testing value from the testing address may be stored in a CPU register outside of the device 170 and the OS 150 may read the testing address within the device 170 and compare that value to the testing value stored in the CPU register. If the values do not match, then the OS 150 may determine that the there is a problem with the device 170, for example, that device 170 has been unplugged or removed.

Figure 4:
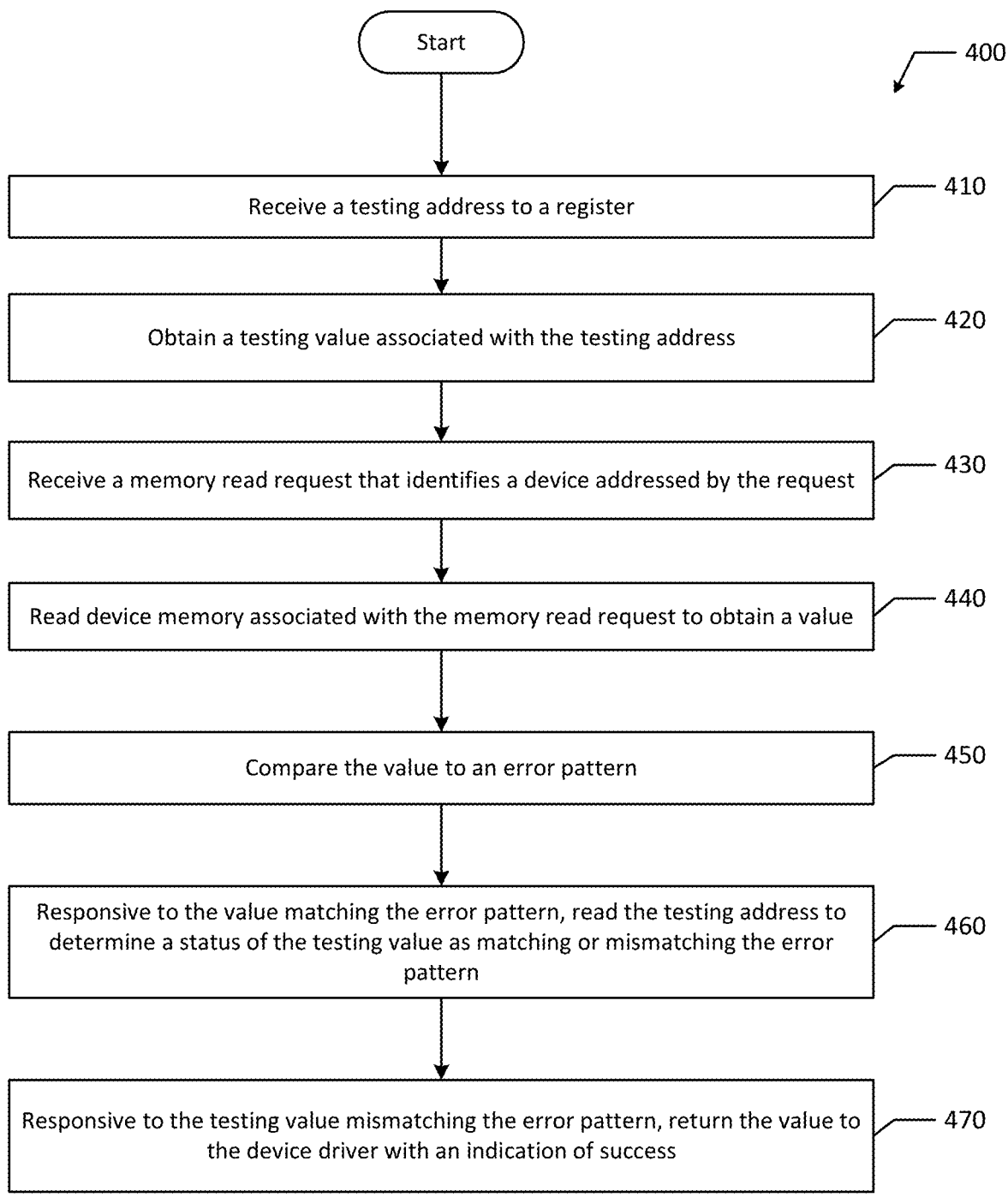
FIG. 4 illustrates a flowchart of an example process for surprise removal detection according to an example embodiment of the present disclosure.

FIG. 4 illustrates a flowchart of an example method 400 for surprise removal detection according to an example embodiment of the present disclosure. Although the example method 400 is described with reference to the flowchart illustrated in FIG. 4, it will be appreciated that many other methods of performing the acts associated with the method 400 may be used. For example, the order of some of the blocks may be changed, certain blocks may be combined with other blocks, one or more blocks may be repeated, and some of the blocks described are optional. The method 400 may be performed by processing logic that may comprise hardware (circuitry, dedicated logic, etc.), software, or a combination of both.

The example method 300 includes detecting a testing address to a register (block 410). For example, an OS 150 may receive a testing address from a device driver 180. The testing address may be an address to a register (e.g., register 172B) with a known-value other than an all-ones value. Then, the OS may obtain a testing value associated with the testing address (block 420). In an example, the OS 150 may read the testing address to obtain the testing value. In another example, the OS 150 may receive the testing value from the device driver 180. The testing value may be a value in a vector control register (e.g., register 172A) within an MSI-X table of the device (e.g., device 170A). In another example, the testing value may be a value in a device identifier register (e.g., register 172B), however, access to a device identifier register may be slower than access to other registers, and thus may not provide the same performance benefits of selecting a testing address from a vector control register.

The OS may also receive a memory read request that identifies a device addressed by the request (block 430). For example, during operation, the driver 180 may request a memory read. In an example, the request may identify the device (e.g., device 170A) that the request is addressed. Then, the OS may read device memory associated with the memory read request to obtain a value (block 440). For example, the OS 150 may receive the request and read device memory associated with the memory read request to obtain a value at the requested address.

After obtaining the value, the OS may compare the value to an error pattern (block 450). For example, the OS 150 may compare the value to an error pattern, such as an all-ones pattern (e.g., 0xFF). In an example, OS 150 compares the bytes in the value to the all-ones pattern according to a length read or a memory comparison function (e.g., memcmp or memchr). For example, the length or size of the all-ones pattern may be 8 bits or 1 byte while the length or size of other memory values is typically larger (e.g., 16 bits or 32 bits). Responsive to the value matching the error pattern, the OS may read the testing address to determine a status of the testing value as matching the error pattern (block 460). For example, if the value from the request to read device memory matches the error pattern, the OS 150 may read the testing address to determine if surprise removal has occurred. Since the testing address is a known value selected from a register (e.g., register 172A), the OS may perform an additional read of the testing address to determine if the value from the original read request is a valid value (e.g., the device 170A utilizes all bits and thus the all-ones value from the memory read is valid) or if the all-ones value from the original read request indicates that the device 170A was removed by surprise.

Responsive to the testing value mismatching the error pattern, the OS may return the value to the device driver with an indication of success (block 470). The testing value mismatching the error pattern indicates that reading device memory from the known testing value (e.g., a value that is not all-ones) was successful thus the device 170A has not been removed by surprise. Conversely, if reading the testing address returned an all-ones pattern and thus matched the all-ones pattern, this would indicate that the device 170A was removed. For example, the OS 150 may return the value from the original memory read to the device driver 180 with an indication of success. In an example, a special value may be returned to indicate success. Since the testing address is selected to be a valid value, if the testing value mismatches the error pattern, then the OS 150 has confirmed that the device 170A has not been unplugged or removed and is still operating normally.

Figure 5A:
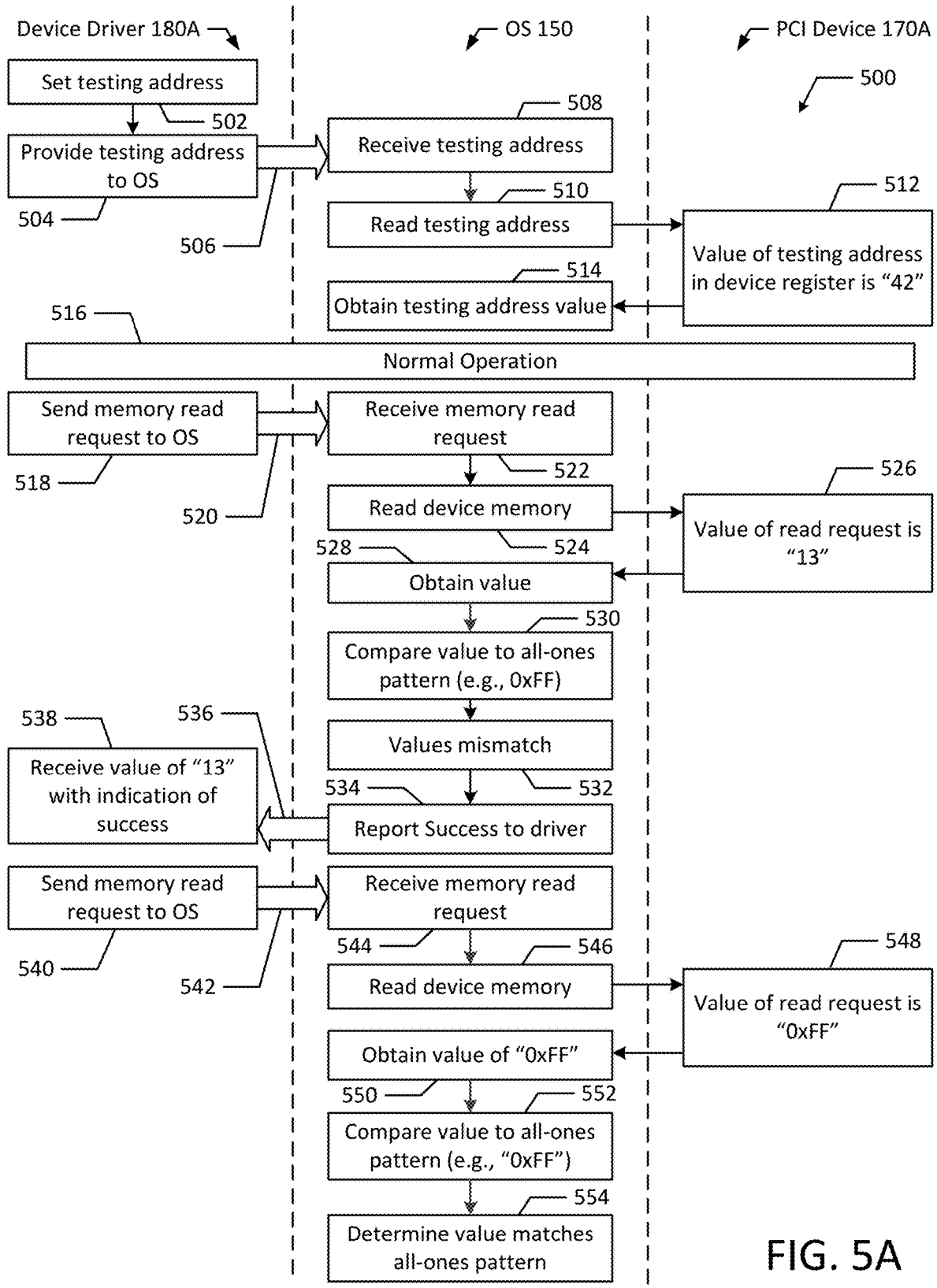
FIGS. 5A and 5B illustrate a flow diagram of an example process for PCI surprise removal detection according to an example embodiment of the present disclosure.
Figure 5B:
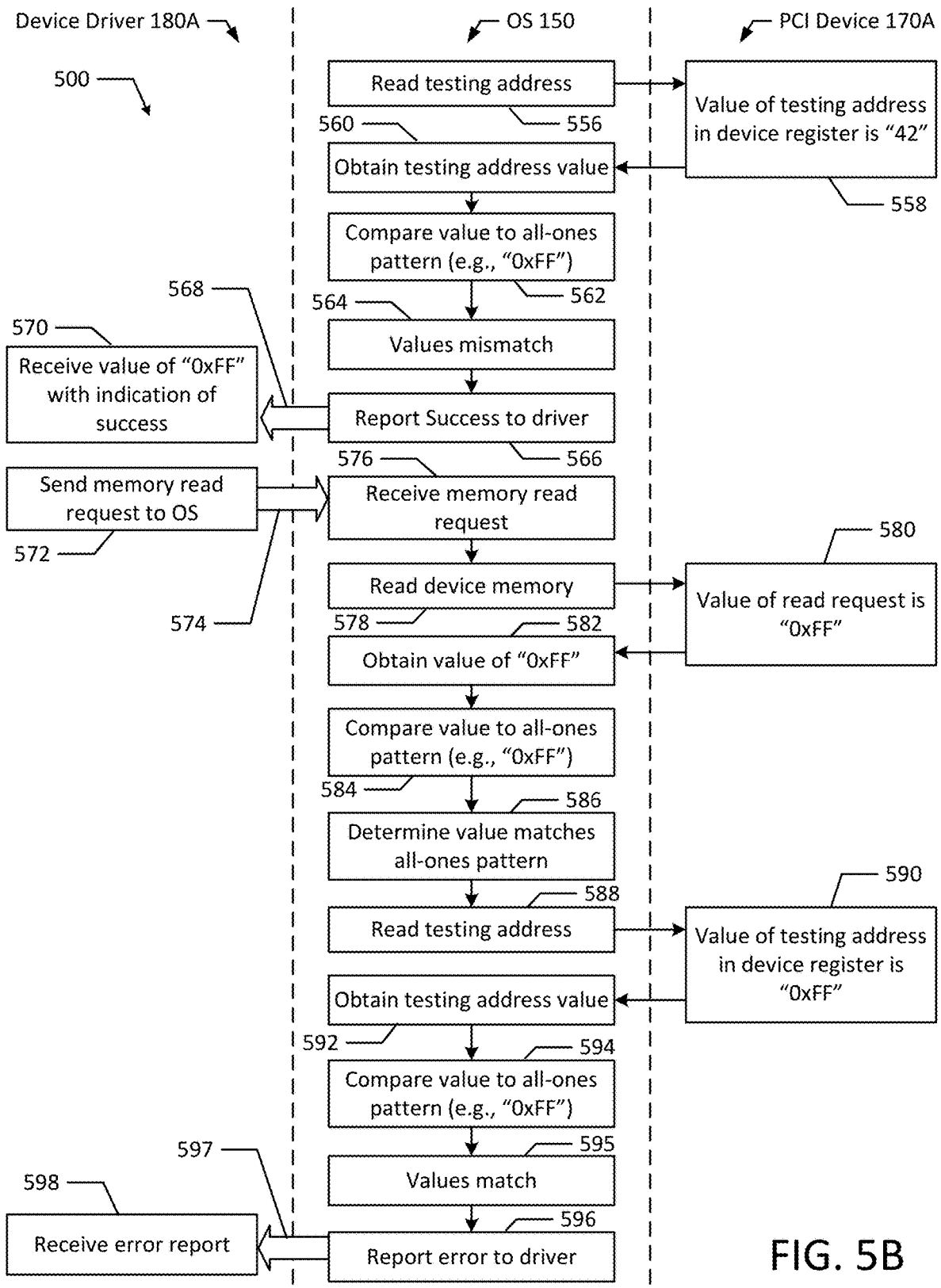

FIGS. 5A and 5B illustrate a flowchart of an example method 500 for PCI surprise removal detection in accordance with an example embodiment of the present disclosure. Although the example method 500 is described with reference to the flowchart illustrated in FIGS. 5A and 5B, it will be appreciated that many other methods of performing the acts associated with the method 500 may be used. For example, the order of some of the blocks may be changed, certain blocks may be combined with other blocks, one or more blocks may be repeated, and some of the blocks described are optional. For example, a device driver 180A, an OS 150 and a PCI device 170A may communicate to perform example method 500.

In the illustrated example, the device driver 180A sets the testing address (block 502). In an example, the testing address is selected from a register 172A (e.g., a vector control register with an MSI or an MSI-X table). The testing address has a valid value that is not equal to an error value or an all-ones value (e.g., 0xFF). By selecting a testing address with a non error value, the testing address may advantageously be used to compare against other memory reads resulting in an error value. Then, the device driver 180A provides the testing address to the OS 150 (blocks 504 and 506). In an example, the device driver 180A may provide the testing address to the OS 150 as a memory read request. Then, the OS 150 receives the testing address (block 508). The OS 150 may receive the testing address in a memory read request that specifies the device (e.g., device 170A) and/or register (e.g., register 172A) associated with the testing address. After receiving the testing address, the OS reads the testing address (block 510). For example, the OS 150 may read the address from a register 172A in PCI device 170A. In the illustrated example, the value of the testing address in device register 172A is "42" (block 512). By reading the address from the register 172A, the OS 150 obtains the testing address value (block 514). In another example, the OS 150 may obtain the testing address value from the device driver 180A.

After establishing the testing address and the testing address value, normal operation may resume (block 516). During normal operation, device driver 180A may send a memory read request to OS 150 (blocks 518 and 520). The memory read request may identify a device (e.g., PCI device 170A) addressed by the request. For example, the device driver 180A may send the OS 150 a read request or an instruction "PCI_CONF_READ_BYTE". Then, the OS 150 receives the memory read request (block 522). The memory read request may indicate an offset (e.g., read 2 bytes at this offset from the address in the request) in device memory. Then, the OS 150 reads device memory (block 524). For example, the OS 150 may read the memory at the specified address or offset (e.g., an offset from a fixed memory address) in device memory of the PCI device 172A addressed by the request.

In the illustrated example, the value of the read request is "13" (block 526). The OS 150 obtains the value (e.g., "13") (block 528) after performing the memory read. Then, the OS 150 compares the value to an all-ones pattern (e.g., 0xFF) (block 530). The OS 150 may compare the value "13" to the all-ones pattern according to a length read or other memory comparison function. Then, the OS 150 determines that the values mismatch (block 532) and the OS 150 reports success to the device driver 180A (blocks 534 and 536). In an example, the OS 150 may report success to the device driver 180A by returning the value to "13" to the device driver 180A with another special value that indicates success. In another example, a success may be indicated by returning the value (e.g., returning the value alone indicates the success). Then, the device driver 18A receives the value "13" with the indication of success (block 538).

The device driver 180A may send another memory read request to OS 150 (blocks 540 and 542). Then, the OS 150 receives the memory read request (block 544). The memory read request may indicate an offset (e.g., read 2 bytes at this offset) in device memory. Then, the OS 150 reads device memory (block 544). For example, the OS 150 may read the memory at the specified address or offset in device memory of the PCI device 172A addressed by the request.

In the illustrated example, the value of the read request is "0xFF" (block 548). The OS 150 obtains the value (e.g., "0xFF") (block 550) after performing the memory read. Then, the OS 150 compares the value to an all-ones pattern (e.g., 0xFF) (block 552). The OS 150 may compare the value "0xFF" to the all-ones pattern (e.g., "0xFF") according to a length read or other memory comparison function. Then, the OS 150 determines that the values match (block 554). Since the values match, the OS 150 reads the testing address (block 556). For example, the OS 150 may read the address from a register 172A in PCI device 170A. In the illustrated example, the value of the testing address in device register 172A is "42" (block 558). By reading the address from the register 172A, the OS 150 obtains the testing address value (block 560). In another example, the OS 150 may obtain the testing address value from the device driver 180A.

Then, the OS 150 compares the testing address value to the all-ones pattern (block 562). Specifically, the OS 150 compares the testing address value obtained from the memory read (e.g., at block 558) to the value of the all-ones pattern (e.g., 0xFF). Then, the OS 150 determines that the values mismatch (block 564). The testing value mismatching the error pattern indicates that reading device memory from the known testing value (e.g., a value that is not all-ones) was successful. By determining that the values mismatch, the OS 150 advantageously determines that the PCI device 170A has not been removed or unplugged, but instead is utilizing the all-ones bits as a valid memory value. If there was a surprise removal of the PCI device, then reading the testing address would have also resulted in an all-ones (e.g., 0xFF) value thereby indicating that the PCI device 170A and its associated registers (e.g., register 172A) were no longer connected.

Then, the OS 150 reports success to the device driver 180A (blocks 566 and 568). In an example, the OS 150 may report success to the device driver 180A by returning the value to "0xFF" to the device driver 180A with another special value that indicates success. In another example, a success may be indicated by returning the value (e.g., returning the value alone indicates the success). Then, the device driver 18A receives the value "0xFF" with the indication of success (block 570).

Again, the device driver 180A may send another memory read request to OS 150 (blocks 572 and 574). Then, the OS 150 receives the memory read request (block 576). The memory read request may indicate an offset (e.g., read 2 bytes at this offset) in device memory. Then, the OS 150 reads device memory (block 578). For example, the OS 150 may read the memory at the specified address or offset in device memory of the PCI device 172A addressed by the request.

In the illustrated example, the value of the read request is "0xFF" (block 580). The OS 150 obtains the value (e.g., "0xFF") (block 582) after performing the memory read. Then, the OS 150 compares the value to an all-ones pattern (e.g., 0xFF) (block 584). The OS 150 may compare the value "0xFF" to the all-ones pattern (e.g., "0xFF") according to a length read or other memory comparison function. Then, the OS 150 determines that the values match (block 586). Since the values match, the OS 150 reads the testing address (block 588). For example, the OS 150 may read the address from a register 172A in PCI device 170A. In the illustrated example, the returned value of the testing address in device register 172A is "0xFF" (block 590). By reading the address from the register 172A, the OS 150 obtains the testing address value (block 592). In the illustrated example, the testing address value returned to the OS 150 is an all-ones value (e.g., 0xFF) because the device has been removed. In another example, the OS 150 may obtain the testing address value from the device driver 180A.

Then, the OS 150 compares the testing address value to the all-ones pattern (block 594). Specifically, the OS 150 compares the testing address value obtained from the memory read (e.g., at block 590) to the all-ones pattern (e.g., 0xFF). Alternatively, the OS 150 may compare the testing address value obtained from the memory read to the value returned from the CPU register. Then, the OS 150 determines that the values match (block 595). The testing value matching the error pattern indicates that reading device memory from the known testing value (e.g., a value that is not all-ones, such as "42") resulted in an unexpected result (e.g., an all-ones pattern) and thus the device 170A has been removed by surprise. By determining that the values match, the OS 150 advantageously determines that the PCI device 170A has been removed or unplugged. Since there was a surprise removal of the PCI device, reading the testing address resulted in an all-ones (e.g., 0xFF) value thereby indicating that the PCI device 170A and its associated registers (e.g., register 172A) were no longer connected.

After detecting surprise removal, the OS reports an error to the device driver 180A (blocks 596 and 597). In an example, the OS 150 may report an error to the device driver 180A by returning an error value or an error message to the device driver 180A. Then, the device driver 18A receives the error report (block 598). In another example, the device driver 180A may supply a value to be returned on error to accommodate APIs, which do not allow error reporting, but instead allow returning an error value on read. Thus, the device driver 180A may supply an "error value", which can be turned to the device driver 180 if the OS 150 determines that an error should have been reported.

In the above example, the surprise removal may be detected in the matter of nanoseconds instead of the order of microseconds waiting for an interrupt in conventional techniques. This early detection advantageously prevents or reduces the likelihood of system crashes and allows the system to recover quickly.

Figure 6:
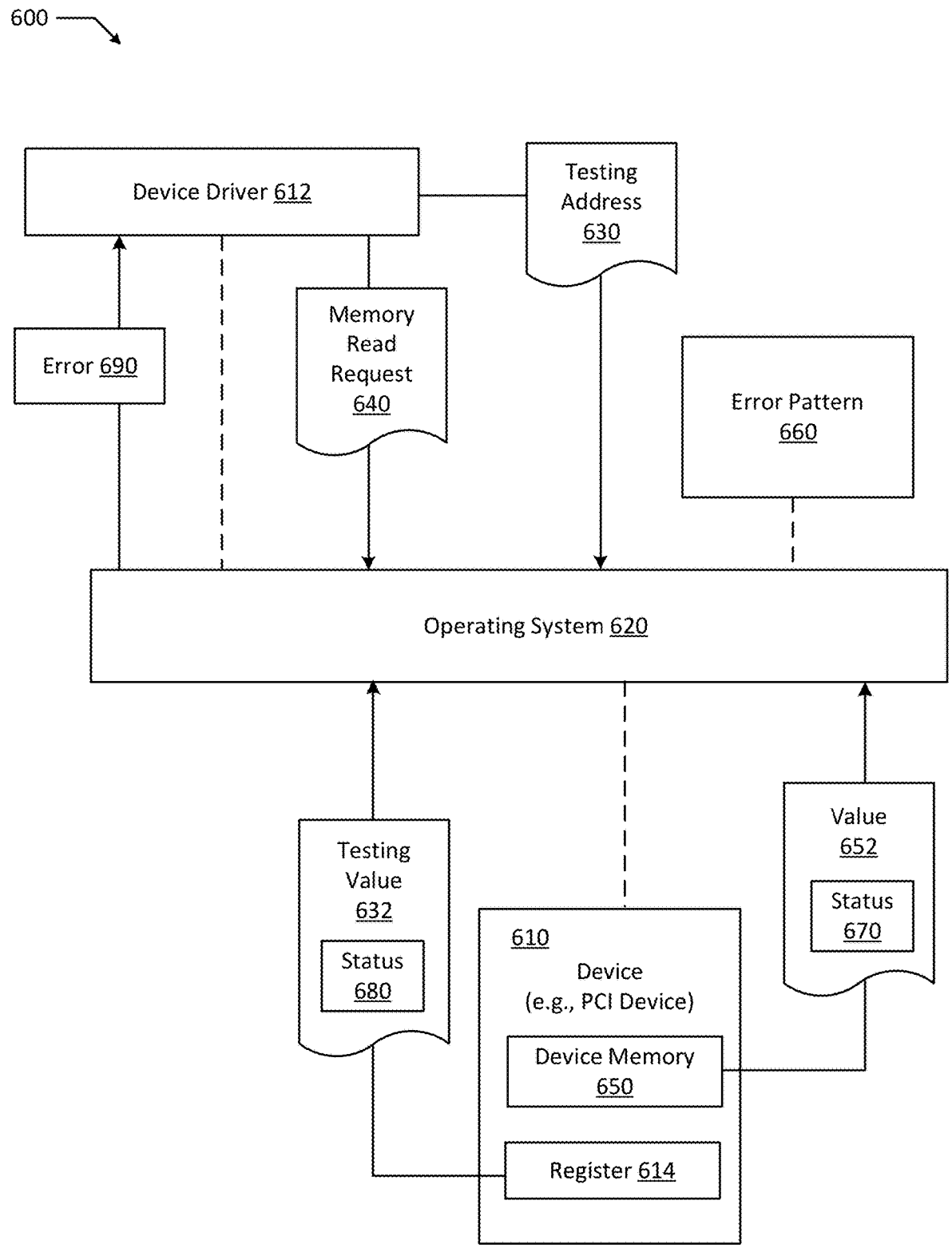
FIG. 6 illustrates a block diagram of an example surprise removal detection system according to an example embodiment of the present disclosure.

FIG. 6 is a block diagram of an example surprise removal detection system 600 according to an example embodiment of the present disclosure. The surprise removal detection system 600 includes a device 610, a device driver 612 associated with the device 610, and an operating system (OS) 620. The operating system 620 may be configured to receive, from the device driver 612, a testing address 630 to a register 614. The operating system 620 may also be configured to obtain a testing value 632 associated with the testing address 620. Additionally, the operating system 630 may be configured to receive a memory read request 640 that identifies a device (e.g., device 610) addressed by the request 640. The operating system is also configured to read device memory 650 associated with the memory read request 640 to obtain a value 652, and compare the value 652 to an error pattern 660 to determine a first status 670 of the memory read (e.g., value 652) as one of matching and mismatching the error pattern. Responsive to determining the first status 670 as matching the error pattern 660, the operating system 620 is further configured to read the testing address 630 to determine a second status 680 of the testing value 632 as one of matching and mismatching the error pattern 660. Responsive to determining the second status 680 as matching, the operating system 620 is configured to return an error 690 to the device driver 612. Additionally, responsive to determining the second status 680 as mismatching, the operating system 620 is configured to return the value 652 to the device driver 612. In an example, the operating system 620 may return the value 652 to the device driver 612 with an indication of success.

When receiving an all-ones value from a memory read request, the operating system 620 may advantageously determine whether the all-ones value is a valid value. For example, a known value (e.g., "42") may be stored at the testing address 630 in register 614 such that when the OS 620 reads testing address 630 in register 614, the OS 60 expects the register 614 to return a value of "42". Since the testing value "42" is a known value, which is returned from reading the testing address from a register (e.g., register 614), the operating system 620 may perform an additional read of the testing address 630 to determine if the value from the original read request 640 is a valid value (e.g., the device 610 utilizes all bits and thus the all-ones value from the memory read is valid) or if the all-ones value from the original read request 640 indicates that the device 610 was removed by surprise. The above determination may be achieved with little additional overhead on the system 600 and may advantageously allow the system 600 to remedy a surprise removal more efficiently than waiting for an interrupt like conventional systems.

It will be appreciated that all of the disclosed methods and procedures described herein can be implemented using one or more computer programs or components. These components may be provided as a series of computer instructions on any conventional computer readable medium or machine readable medium, including volatile or non-volatile memory, such as RAM, ROM, flash memory, magnetic or optical disks, optical memory, or other storage media. The instructions may be provided as software or firmware, and/or may be implemented in whole or in part in hardware components such as ASICs, FPGAs, DSPs or any other similar devices. The instructions may be configured to be executed by one or more processors, which when executing the series of computer instructions, performs or facilitates the performance of all or part of the disclosed methods and procedures.

Aspects of the subject matter described herein may be useful alone or in combination with one or more other aspects described herein. In a 1st exemplary aspect of the present disclosure, a method includes receiving, by an operating system (OS), from a device driver, a testing address to a register; obtaining, by the OS, a testing value associated with the testing address; receiving, by the OS, a memory read request that identifies a device addressed by the request; reading, by the OS, device memory associated with the memory read request to obtain a value and comparing, by the OS, the value to an error pattern to determine a first status of the memory read as one of matching and mismatching the error pattern. The method also includes responsive to determining the first status as matching the error pattern, reading, by the OS, the testing address to determine a second status of the testing value as one of matching and mismatching the error pattern. Additionally, the method includes responsive to determining the second status as matching, returning, by the OS, an error to the device driver.

In a 2nd exemplary aspect of the present disclosure, which may be used in combination with any one or more of the preceding aspects (e.g., the 1st aspect), the method further includes receiving, by the OS, a second memory read request; reading, by the OS, the device memory associated with the second memory read request to obtain a second value; and comparing, by the OS, the second value to the error pattern to determine a third status of the second memory read as one of matching and mismatching the error pattern. Additionally, the method includes responsive to determining the third status as mismatching the error pattern, returning, by the OS, the second value to the device driver with an indication of success.

In a 3rd exemplary aspect of the present disclosure, which may be used in combination with any one or more of the preceding aspects (e.g., the 2nd aspect), the indication of success is a special value returned by the OS.

In a 4th exemplary aspect of the present disclosure, which may be used in combination with any one or more of the preceding aspects (e.g., the 1st aspect), the testing address has a testing value other than the error pattern when the device is connected.

In a 5th exemplary aspect of the present disclosure, which may be used in combination with any one or more of the preceding aspects (e.g., the 1st aspect), bytes in the value are compared to the error pattern according to a length read.

In a 6th exemplary aspect of the present disclosure, which may be used in combination with any one or more of the preceding aspects (e.g., the 1st aspect), the register is one of a vector control register and a device identifier register.

In a 7th exemplary aspect of the present disclosure, which may be used in combination with any one or more of the preceding aspects (e.g., the 6th aspect), the vector control register is within a message signaled interrupts (MSI) table of the device.

In an 8th exemplary aspect of the present disclosure, which may be used in combination with any one or more of the preceding aspects (e.g., the 7th aspect), the MSI table is a MSI-X table.

In a 9th exemplary aspect of the present disclosure, which may be used in combination with any one or more of the preceding aspects (e.g., the 1st aspect), the error pattern is an all-ones pattern.

In a 10th exemplary aspect of the present disclosure, which may be used in combination with any one or more of the preceding aspects (e.g., the 1st aspect), obtaining the testing value by the OS includes reading, by the OS, the testing address to obtain the testing value.

In an 11th exemplary aspect of the present disclosure, which may be used in combination with any one or more of the preceding aspects (e.g., the 1st aspect), obtaining the testing value by the OS includes receiving, by the OS, the testing value from the device driver.

Aspects of the subject matter described herein may be useful alone or in combination with one or more other aspects described herein. In a 12th exemplary aspect of the present disclosure, a method includes receiving, by an operating system (OS), from a device driver, a testing address to a register; obtaining, by the OS, a testing value associated with the testing address; receiving, by the OS, a memory read request that identifies a device addressed by the request; reading, by the OS, device memory associated with the memory read request to obtain a value and comparing, by the OS, the value to an error pattern to determine a first status of the memory read as one of matching and mismatching the error pattern. The method also includes responsive to determining the first status as matching the error pattern, reading, by the OS, the testing address to determine a second status of the testing value as one of matching and mismatching the error pattern. Additionally, the method includes responsive to determining the second status as mismatching, returning, by the OS, the value to the device driver with an indication of success.

In a 13th exemplary aspect of the present disclosure, which may be used in combination with any one or more of the preceding aspects (e.g., the 12th aspect), the method further includes receiving, by the OS, a second memory read request; reading, by the OS, the device memory associated with the second memory read request to obtain a second value and comparing, by the OS, the second value to the error pattern to determine a third status of the second memory read as one of matching and mismatching the error pattern. The method also includes responsive to determining the third status as mismatching the error pattern, returning, by the OS, the value to the device driver with an indication of success.

In a 14th exemplary aspect of the present disclosure, which may be used in combination with any one or more of the preceding aspects (e.g., the 13th aspect), the indication of success is a special value returned by the OS.

In a 15th exemplary aspect of the present disclosure, which may be used in combination with any one or more of the preceding aspects (e.g., the 12th aspect), the testing address has a testing value other than the error pattern when the device is connected.

In a 16th exemplary aspect of the present disclosure, which may be used in combination with any one or more of the preceding aspects (e.g., the 12th aspect), bytes in the value are compared to the error pattern according to a length read.

In a 17th exemplary aspect of the present disclosure, which may be used in combination with any one or more of the preceding aspects (e.g., the 12th aspect), the register is one of a vector control register and a device identifier register.

In an 18th exemplary aspect of the present disclosure, which may be used in combination with any one or more of the preceding aspects (e.g., the 17th aspect), the vector control register is within a message signaled interrupts (MSI) table of the device.

In a 19th exemplary aspect of the present disclosure, which may be used in combination with any one or more of the preceding aspects (e.g., the 18th aspect), the MSI table is a MSI-X table.

In a 20th exemplary aspect of the present disclosure, which may be used in combination with any one or more of the preceding aspects (e.g., the 12th aspect), the error pattern is an all-ones pattern.

In a 21st exemplary aspect of the present disclosure, which may be used in combination with any one or more of the preceding aspects (e.g., the 12th aspect), obtaining the testing value by the OS includes reading, by the OS, the testing address to obtain the testing value.

In a 22nd exemplary aspect of the present disclosure, which may be used in combination with any one or more of the preceding aspects (e.g., the 12th aspect), obtaining the testing value by the OS includes receiving, by the OS, the testing value from the device driver.

Aspects of the subject matter described herein may be useful alone or in combination with one or more other aspects described herein. In a 23rd exemplary aspect of the present disclosure, a system includes a device, a device driver associated with the device, and an operating system (OS). The operating system is configured to receive, from the device driver, a testing address to a register, obtain a testing value associated with the testing address, receive a memory read request that identifies a device addressed by the request, read device memory associated with the memory read request to obtain a value, and compare the value to an error pattern to determine a first status of the memory read as one of matching and mismatching the error pattern. Responsive to determining the first status as matching the error pattern, the operating system is further configured to read the testing address to determine a second status of the testing value as one of matching and mismatching the error pattern. Responsive to determining the second status as matching, the operating system is configured to return an error to the device driver.

In a 24th exemplary aspect of the present disclosure, which may be used in combination with any one or more of the preceding aspects (e.g., the 23rd aspect), the OS is further configured to receive a second memory read request, read the device memory associated with the second memory read request to obtain a second value, compare the second value to the error pattern to determine a third status of the second memory read as one of matching and mismatching the error pattern, and responsive to determining the third status as mismatching the error pattern, return the value to the device driver with an indication of success.

In a 25th exemplary aspect of the present disclosure, which may be used in combination with any one or more of the preceding aspects (e.g., the 24th aspect), the indication of success is a special value returned by the OS.

In a 26th exemplary aspect of the present disclosure, which may be used in combination with any one or more of the preceding aspects (e.g., the 23rd aspect), the testing address has a testing value other than the error pattern when the device is connected.

In a 27th exemplary aspect of the present disclosure, which may be used in combination with any one or more of the preceding aspects (e.g., the 23rd aspect), bytes in the value are compared to the error pattern according to a length read.

In a 28th exemplary aspect of the present disclosure, which may be used in combination with any one or more of the preceding aspects (e.g., the 23rd aspect), the register is one of a vector control register and a device identifier register.

In a 29th exemplary aspect of the present disclosure, which may be used in combination with any one or more of the preceding aspects (e.g., the 28th aspect), the vector control register is within a message signaled interrupts (MSI) table of the device.

In a 30th exemplary aspect of the present disclosure, which may be used in combination with any one or more of the preceding aspects (e.g., the 29th aspect), the MSI table is a MSI-X table.

In a 31st exemplary aspect of the present disclosure, which may be used in combination with any one or more of the preceding aspects (e.g., the 23rd aspect), the device is a peripheral component interface (PCI) device.

In a 32nd exemplary aspect of the present disclosure, which may be used in combination with any one or more of the preceding aspects (e.g., the 23rd aspect), the error pattern is an all-ones pattern.

In a 33rd exemplary aspect of the present disclosure, which may be used in combination with any one or more of the preceding aspects (e.g., the 23rd aspect), the OS is further configured to read the testing address to obtain the testing value.

In a 34th exemplary aspect of the present disclosure, which may be used in combination with any one or more of the preceding aspects (e.g., the 23rd aspect), the OS if further configured to receive the testing value from the device driver.

Aspects of the subject matter described herein may be useful alone or in combination with one or more other aspects described herein. In a 35th exemplary aspect of the present disclosure, a system includes a device, a device driver associated with the device, and an operating system (OS). The OS is configured to receive, from the device driver, a testing address to a register, obtain a testing value associated with the testing address, receive a memory read request that identifies a device addressed by the request, read device memory associated with the memory read request to obtain a value, and compare the value to an error pattern to determine a first status of the memory read as one of matching and mismatching the error pattern. Responsive to determining the first status as matching the error pattern, the OS is configured to read the testing address to determine a second status of the testing value as one of matching and mismatching the error pattern. Responsive to determining the second status as mismatching, the OS is configured to return the value to the device driver with an indication of success.

In a 36th exemplary aspect of the present disclosure, which may be used in combination with any one or more of the preceding aspects (e.g., the 35th aspect), the OS is further configured to: receive a second memory read request, read the device memory associated with the second memory read request to obtain a second value, and compare the second value to the error pattern to determine a third status of the second memory read as one of matching and mismatching the error pattern. Responsive to determining the third status as mismatching the error pattern, the OS is configured to return the value to the device driver with an indication of success.

In a 37th exemplary aspect of the present disclosure, which may be used in combination with any one or more of the preceding aspects (e.g., the 36th aspect), the indication of success is a special value returned by the OS.

In a 38th exemplary aspect of the present disclosure, which may be used in combination with any one or more of the preceding aspects (e.g., the 35th aspect), the indication of success is a special value returned by the OS.

In a 39th exemplary aspect of the present disclosure, which may be used in combination with any one or more of the preceding aspects (e.g., the 35th aspect), bytes in the value are compared to the error pattern according to a length read.

In a 40th exemplary aspect of the present disclosure, which may be used in combination with any one or more of the preceding aspects (e.g., the 35th aspect), the register is one of a vector control register and a device identifier register.

In a 41st exemplary aspect of the present disclosure, which may be used in combination with any one or more of the preceding aspects (e.g., the 35th aspect), the vector control register is within a message signaled interrupts (MSI) table of the device.

In a 42nd exemplary aspect of the present disclosure, which may be used in combination with any one or more of the preceding aspects (e.g., the 41st aspect), the MSI table is a MSI-X table.

In a 43rd exemplary aspect of the present disclosure, which may be used in combination with any one or more of the preceding aspects (e.g., the 35th aspect), the device is a peripheral component interface (PCI).

In a 44th exemplary aspect of the present disclosure, which may be used in combination with any one or more of the preceding aspects (e.g., the 35th aspect), the error pattern is an all-ones pattern.

In a 45th exemplary aspect of the present disclosure, which may be used in combination with any one or more of the preceding aspects (e.g., the 35th aspect), the OS is further configured to read the testing address to obtain the testing value.

In a 46th exemplary aspect of the present disclosure, which may be used in combination with any one or more of the preceding aspects (e.g., the 35th aspect), the OS if further configured to receive the testing value from the device driver.

Aspects of the subject matter described herein may be useful alone or in combination with one or more other aspects described herein. In a 47th exemplary aspect of the present disclosure, a system includes a first means for receiving, from a device driver, a testing address to a register, a first means for obtaining a testing value associated with the testing address, a second means for receiving a memory read request that identifies a device addressed by the request, a second means for reading device memory associated with the memory read request to obtain a value, a means for comparing the value to an error pattern to determine a first status of the memory read as one of matching and mismatching the error pattern, a third means for reading the testing address to determine a second status of the testing value as one of matching and mismatching the error pattern responsive to determining the first status as matching the error pattern, a first means for returning an error to the device driver responsive to determining the second status as matching, and a second means for returning the value to the device driver with an indication of success responsive to determining the second status as mismatching.

Aspects of the subject matter described herein may be useful alone or in combination with one or more other aspects described herein. In a 48th exemplary aspect of the present disclosure, a non-transitory machine-readable medium stores code, which when executed by a processor is configured to receive, from a device driver, a testing address to a register, obtain a testing value associated with the testing address, receive a memory read request that identifies a device addressed by the request, read device memory associated with the memory read request to obtain a value and compare the value to an error pattern to determine a first status of the memory read as one of matching and mismatching the error pattern. Additionally, the non-transitory machine readable medium is configured to read the testing address to determine a second status of the testing value as one of matching and mismatching the error pattern responsive to determining the first status as matching the error pattern. The non-transitory machine readable medium is also configured to read the testing address to determine a second status of the testing value as one of matching and mismatching the error pattern responsive to determining the first status as matching the error pattern. Responsive to determining the second status as mismatching, the non-transitory machine readable medium is configured to return the value to the driver with an indication of success. Responsive to determining the second status as matching, the non-transitory machine readable medium is configured to return an error to the device driver.

To the extent that any of these aspects are mutually exclusive, it should be understood that such mutual exclusivity shall not limit in any way the combination of such aspects with any other aspect whether or not such aspect is explicitly recited. Any of these aspects may be claimed, without limitation, as a system, method, apparatus, device, medium, etc.

It should be understood that various changes and modifications to the example embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method comprising:
receiving, by an operating system (OS), from a device driver, a testing address to a register;
obtaining, by the OS, a testing value associated with the testing address;
receiving, by the OS, a memory read request that identifies a device addressed by the request;
reading, by the OS, device memory associated with the memory read request to obtain a value;
comparing, by the OS, the value to an error pattern to determine a first status of the memory read as one of matching and mismatching the error pattern;
responsive to determining the first status as matching the error pattern, reading, by the OS, the testing address to determine a second status of the testing value as one of matching and mismatching the error pattern; and
responsive to determining the second status as matching, returning, by the OS, an error to the device driver.

2. The method of claim 1, further comprising:
receiving, by the OS, a second memory read request;
reading, by the OS, the device memory associated with the second memory read request to obtain a second value;
comparing, by the OS, the second value to the error pattern to determine a third status of the second memory read as one of matching and mismatching the error pattern; and
responsive to determining the third status as mismatching the error pattern, returning, by the OS, the second value to the device driver with an indication of success.

3. The method of claim 2, wherein the indication of success is a special value returned by the OS.

4. The method of claim 1, wherein the testing address has a testing value other than the error pattern when the device is connected.

5. The method of claim 1, wherein bytes in the value are compared to the error pattern according to a length read.

6. The method of claim 1, wherein the register is one of a vector control register and a device identifier register.

7. The method of claim 6, wherein the vector control register is within a message signaled interrupts (MSI) table of the device.

8. The method of claim 7, wherein the MSI table is a MSI-X table.

9. The method of claim 1, wherein the error pattern is an all-ones pattern.

10. The method of claim 1, wherein obtaining the testing value by the OS includes reading, by the OS, the testing address to obtain the testing value.

11. The method of claim 1, wherein obtaining the testing value by the OS includes receiving, by the OS, the testing value from the device driver.

12. A method comprising:
receiving, by an operating system (OS), from a device driver, a testing address to a register;
obtaining, by the OS, a testing value associated with the testing address;
receiving, by the OS, a memory read request that identifies a device addressed by the request;
reading, by the OS, device memory associated with the memory read request to obtain a value;
comparing, by the OS, the value to an error pattern to determine a first status of the memory read as one of matching and mismatching the error pattern;
responsive to determining the first status as matching the error pattern, reading, by the OS, the testing address to determine a second status of the testing value as one of matching and mismatching the error pattern; and
responsive to determining the second status as mismatching, returning, by the OS, the value to the device driver with an indication of success.

13. The method of claim 12, further comprising:
receiving, by the OS, a second memory read request;
reading, by the OS, the device memory associated with the second memory read request to obtain a second value;
comparing, by the OS, the second value to the error pattern to determine a third status of the second memory read as one of matching and mismatching the error pattern; and
responsive to determining the third status as mismatching the error pattern, returning, by the OS, the value to the device driver with an indication of success.

14. The method of claim 13, wherein the indication of success is a special value returned by the OS.

15. The method of claim 12, wherein the testing address has a testing value other than the error pattern when the device is connected.

16. The method of claim 12, wherein bytes in the value are compared to the error pattern according to a length read.

17. The method of claim 12, wherein the error pattern is an all-ones pattern.

18. The method of claim 12, wherein obtaining the testing value by the OS includes reading, by the OS, the testing address to obtain the testing value.

19. The method of claim 12, wherein obtaining the testing value by the OS includes receiving, by the OS, the testing value from the device driver.

20. A system comprising:
a device;
a device driver associated with the device; and
an operating system (OS), wherein the OS is configured to:
receive, from the device driver, a testing address to a register,
obtain a testing value associated with the testing address,
receive a memory read request that identifies a device addressed by the request,
read device memory associated with the memory read request to obtain a value,
compare the value to an error pattern to determine a first status of the memory read as one of matching and mismatching the error pattern,
responsive to determining the first status as matching the error pattern, read the testing address to determine a second status of the testing value as one of matching and mismatching the error pattern, and
responsive to determining the second status as matching, return an error to the device driver.

* * * * *